US006768386B1

(12) United States Patent
Miller

(10) Patent No.: US 6,768,386 B1
(45) Date of Patent: Jul. 27, 2004

(54) DUAL CLOCK PACKAGE OPTION

(75) Inventor: Leah M. Miller, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/420,219

(22) Filed: Apr. 22, 2003

(51) Int. Cl.[7] .................................................. H03H 7/00
(52) U.S. Cl. ........................... 331/1; 331/246; 331/247; 257/691; 257/698
(58) Field of Search ........................... 331/1, 246, 247; 257/691, 698, 664, 728

(56) References Cited

U.S. PATENT DOCUMENTS

| | | | | |
|---|---|---|---|---|
| 4,091,430 A | | 5/1978 | Berard ........................ 361/43 |
| 4,288,694 A | | 9/1981 | Ahrons ....................... 250/374 |
| 4,631,412 A | | 12/1986 | Turlej ......................... 250/381 |
| 5,219,771 A | | 6/1993 | Miyake ....................... 438/151 |
| 5,227,739 A | * | 7/1993 | Mandai et al. ................ 331/96 |
| 5,278,524 A | * | 1/1994 | Mullen ........................... 333/1 |
| 5,300,899 A | * | 4/1994 | Suski ............................. 333/1 |
| 5,675,298 A | * | 10/1997 | Bhagwan et al. ............... 333/1 |
| 6,184,702 B1 | | 2/2001 | Takahashi et al. ............ 326/21 |
| 6,339,256 B2 | | 1/2002 | Akram ....................... 257/691 |
| 6,617,943 B1 | * | 9/2003 | Fazelpour ................... 333/204 |
| 6,657,307 B2 | | 12/2003 | Iwamoto ..................... 257/773 |

* cited by examiner

*Primary Examiner*—Tuan T. Lam
*Assistant Examiner*—Hiep Nguyen
(74) *Attorney, Agent, or Firm*—Luedeka, Neely & Graham, P.C.

(57) ABSTRACT

A package substrate having a first layer adapted to received an integrated circuit, with electrically conductive contacts adapted to send and receive signals to and from the integrated circuit. The first layer includes a ground plane. A second layer is disposed underneath the first layer, and has electrically conductive traces, including a single ended clock signal trace and a set of two differential clock signal traces. The single ended clock signal trace and the set of two differential clock signal traces are substantially surrounded by grounded guard traces from all other electrically conductive traces on the second layer. A first electrically nonconductive layer is disposed between the first layer and the second layer.

20 Claims, 4 Drawing Sheets

DUAL CLOCK PACKAGE OPTION

FIELD

This invention relates to the field of integrated circuit fabrication. More particularly, this invention relates to standardized packaging options for integrated circuits.

BACKGROUND

Some types of integrated circuits are completely custom designed, where each of the electrical devices in the integrated circuit is specifically selected for the custom design, and the integrated circuit is laid out in a customize manner. Such integrated circuits tend to have a relatively large amount of overhead associated with them. For example, there is a large amount of design work involved in producing such a customized integrated circuit. Further, customized mask sets and tooling are required to produce the integrated circuits. When it is expected that a very large number of the integrated circuits will be sold, then it can be cost effective to invest in the overhead associated with the customized integrated circuit, as the overhead can be paid off over a large number of the integrated circuits.

However, there are other applications where such a large number of sales of the integrated circuit is not expected. In these applications, it tends to be cost prohibitive to design the integrated circuit from scratch, so to speak, and to invest in completely customized mask sets and tooling, because there will not be enough of the integrated circuits fabricated to justify such a large investment.

For these smaller-number applications, a different type of integrated circuit is commonly used, called an application specific integrated circuit, or ASIC. ASICs are designed using standardized design elements, or modules, which are combined in a desired configuration to support the intended application. In other words, the design of the integrated circuit is application-specific, as the name implies. ASICs tend to be much cheaper to design and produce than custom integrated circuits, because the standardized design elements have already been designed. Further, mask designs already exist for the design elements. Thus, there is a tremendous head-start on the design process, and ASICs therefore tend to be much less expensive to fabricate than completely customized integrated circuits.

Unfortunately, because the standardized design elements of an ASIC can be combined in a variety of ways, the cost savings associated with standardization have typically not been extended to the packaging used for the ASICs. For example, because different ASICs—even those using similar standardized modules—tend to be laid out with the standardized modules in different configurations, the package substrate typically requires a different configuration for each such design. Thus, all the costs of a completely customized package design tend to be incurred, even when using standardized modules in an ASIC design.

What is needed, therefore, is a package design with standardized elements for use with an ASIC, which package design can help reduce the costs associated with designing packages for different ASICs.

SUMMARY

The above and other needs are met by a package substrate having a first layer adapted to received an integrated circuit, with electrically conductive contacts adapted to send and receive signals to and from the integrated circuit. The first layer includes a ground plane. A second layer is disposed underneath the first layer, and has electrically conductive traces, including a single ended clock signal trace and a set of two differential clock signal traces. The single ended clock signal trace and the set of two differential clock signal traces are substantially surrounded by grounded guard traces from all other electrically conductive traces on the second layer. A first electrically nonconductive layer is disposed between the first layer and the second layer.

In this manner, the package substrate according to the present invention can accommodate either a single ended clock or a differential clock, or both, without the need of specially designing the package substrate for any of the various options. Thus, the design expenses associated with designing packaged integrated circuits using the package substrate are commensurately reduced. If, for example, either the single ended clock or the differential clock is not included in the integrated circuit design, then the structure associated with the unused clock can be used for any other signal routing that may be desired.

In various preferred embodiments, through-holes are disposed in the first electrically nonconductive layer, with electrically conductive vias disposed in the through-holes. The electrically conductive vias preferably make electrical connections between the ground plane on the first layer and the grounded guard traces on the second layer. Preferably, the electrically conductive vias are regularly spaced along the grounded guard traces, and most preferably are regularly spaced along the grounded guard traces at a distance determined at least in part on an operating frequency.

In a preferred embodiment, the package substrate includes a third layer disposed underneath the second layer, where the third layer includes a ground plane. A second electrically nonconductive layer is disposed between the second layer and the third layer. Through-holes are preferably disposed in the second electrically nonconductive layer, with electrically conductive vias disposed in the through-holes. Preferably, the electrically conductive vias make electrical connections between the ground plane on the third layer and the grounded guard traces on the second layer. Preferably, the electrically conductive vias are regularly spaced along the grounded guard traces, and most preferably are regularly spaced along the grounded guard traces at a distance determined at least in part on an operating frequency.

In one embodiment, the third layer is a power plane layer. Most preferably the guard traces surround as much of the single ended clock signal trace and the set of two differential clock signal traces as possible. The guard traces preferably additionally extend substantially between the single ended clock signal trace and the set of two differential clock signal traces.

According to another aspect of the invention there is described a packaged integrated circuit including a package substrate having a first layer adapted to received an integrated circuit. The first layer has electrically conductive contacts adapted to send and receive signals to and from the integrated circuit. The first layer includes a ground plane. A second layer is disposed underneath the first layer. The second layer has electrically conductive traces, including a single ended clock signal trace and a set of two differential clock signal traces. The single ended clock signal trace and the set of two differential clock signal traces are substantially surrounded by grounded guard traces from all other electrically conductive traces on the second layer. A first electrically nonconductive layer is disposed between the first layer and the second layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
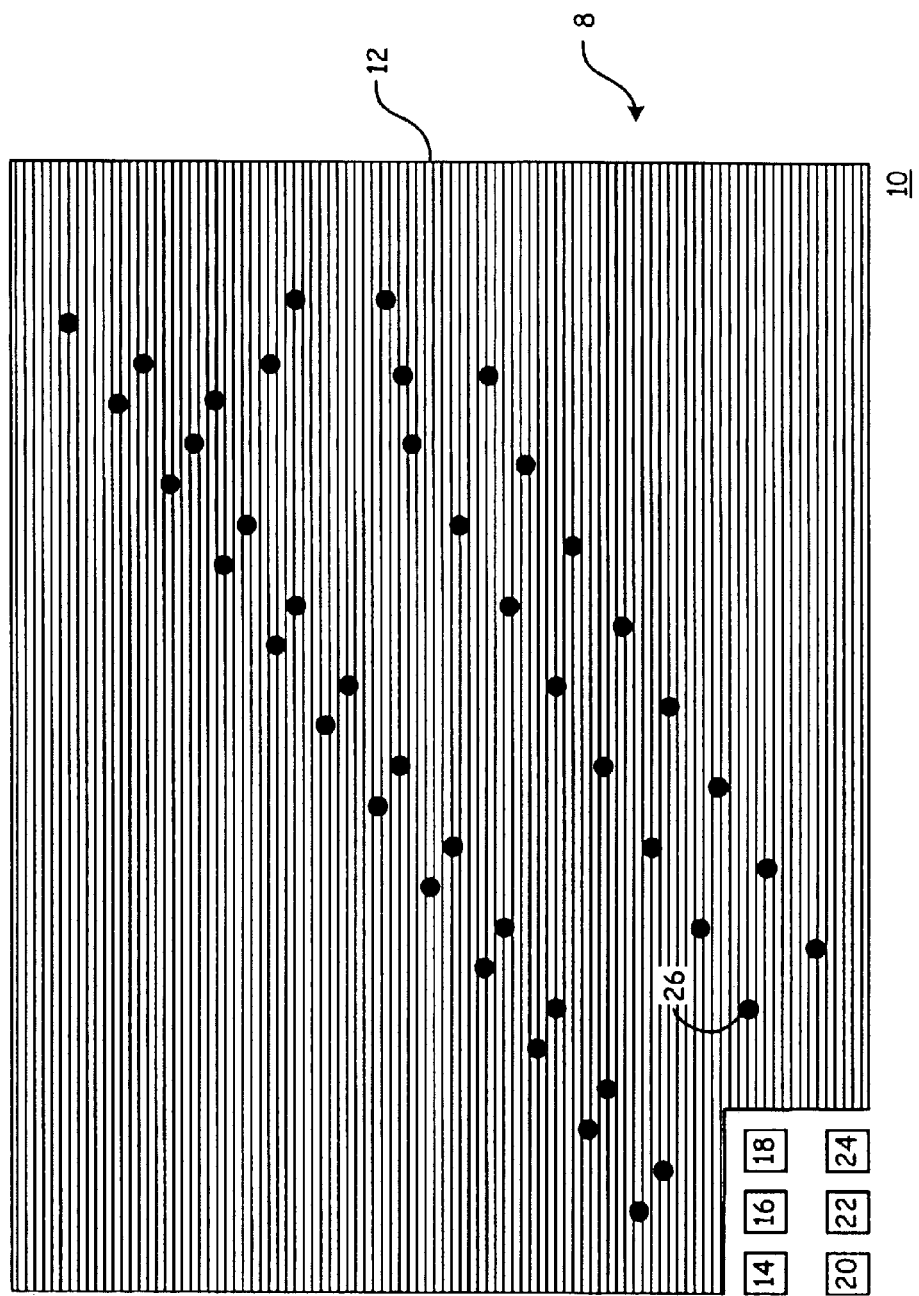
FIG. 1 is a top plan view of a first layer of a package substrate, including a ground plane layer.

With reference now to FIG. 1, there is depicted a top plan view of a portion of a first layer 8 of a package substrate 10, including a ground plane layer 12 according to a preferred embodiment of the present invention. The package substrate 10 is adapted to receive an integrated circuit, such as an ASIC, and make electrical connections with the integrated circuit through the electrical contacts available at the top surface of the package substrate 10. Any electrical connection technology can work with the present invention, including ball grid array and chip scale package connections. Further, the invention is compatible with many different package types, including ceramic and plastic, and with either wire bond or flip chip devices.

The ground plane 12 is preferably formed of a layer of an electrically conductive material, such as a metal. Also formed in the first layer are electrically conductive contacts 14, 16, 18, 20, 22, and 24 for making electrical connections between the package substrate 10 and an integrated circuit. It is appreciated that only a portion of the package substrate 10 is depicted in FIG. 1, so that the figures are not burdened with undue detail. It is further appreciated that the various elements as described and depicted in the figures have been greatly simplified from what they would be in an actual implementation. This has again been done so that attention is not distracted by details which are not as important for gaining an understanding of the invention.

Depicted in FIG. 1 are electrically conductive vias 26, which are disposed in through-holes in an electrically nonconductive layer disposed underneath the first layer 8. It is appreciated that the term "through-hole" as used herein refers not only to openings for electrically conductive vias that extend completely through all layers of a substrate or printed circuit board, but refers also to the so-called blind and buried vias, which are predominantly used in current technology. The electrically conductive vias 26 preferably make electrical connection to the ground plane 12 of the first layer 8, and provide functions as described in more detail elsewhere herein.

Figure 2:
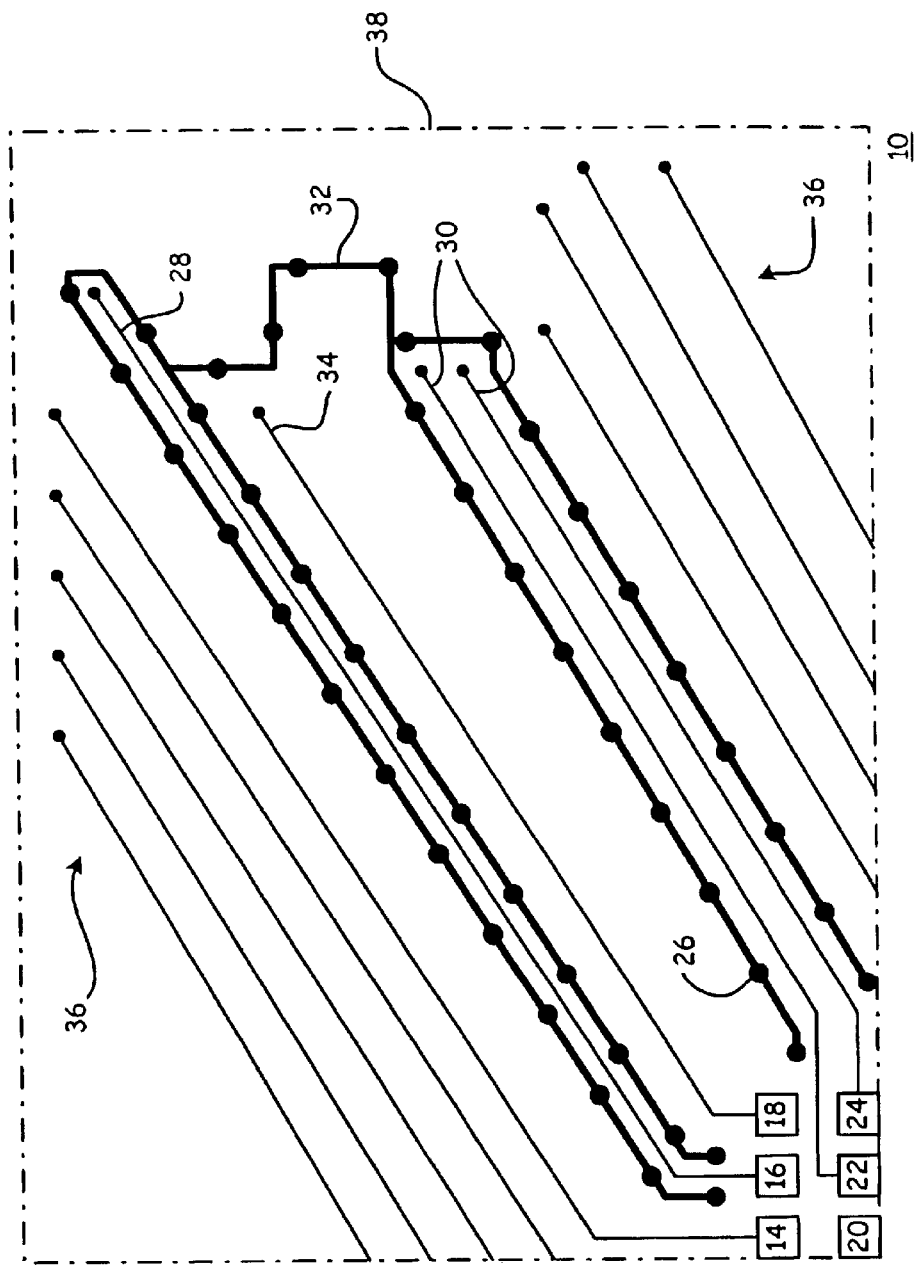
FIG. 2 is a top plan view of a second layer of package substrate, including a routing layer.

With reference now to FIG. 2, there is depicted a portion of a second layer 38 of the package substrate 10. The second layer 38 includes electrically conductive traces 28, 30, 32, 34, and 36, and electrically conductive lands 14, 16, 18, 20, 22, and 24. Although the electrically conductive lands 14, 16, 18, 20, 22, and 24 have the same shape and reference number as the contacts depicted in FIG. 1, it is appreciated that they are not exactly the same elements. Conductive lands 14, 16, 18, 20, 22, and 24 are given the same reference number as the contacts depicted in FIG. 1 because they are electrically connected with the contacts by electrically conductive vias, and by having both sets of elements share reference numbers, the relationship between the two is more easily understood.

Electrically conductive land 16 is, in the embodiment depicted, preferably adapted to conduct signals for a single ended clock on the integrated circuit, and is electrically connected to electrically conductive trace 28, which routes the single ended clock signals from the electrically conductive land 16 to another point on the package substrate 10. Similarly, electrically conductive lands 22 and 24 are, in the embodiment depicted, preferably adapted to conduct signals for a differential clock on the integrated circuit, and are electrically connected to electrically conductive trace pair 30, which route the differential clock signals from the electrically conductive lands 22 and 24 to other points on the package substrate 10.

The electrically conductive trace 28, which carriers the signals for the single ended clock, and the electrically conductive trace pair 30, which carry the signals for the differential clock, are preferably substantially bounded by electrically conductive grounded guard traces 32. The electrically conductive grounded guard traces 32 are preferably held at a logical low or ground potential, and serve to assist in the isolation of the traces 28 and 30, which are adapted to conduct sensitive clock signals. Thus, there are preferably no other traces between any of the traces 28 and 30 and the guard traces 32 which bound them, in the manner as depicted in FIG. 2. Thus, the guard traces 32 preferably separate the clock traces 28 and 30 from outlying traces 36, disposed on either side of the clock traces 28 and 30, and the guard traces 32 also preferably separate the clock traces 28 and 30 from intervening traces 34, disposed between the clock traces 28 and 30.

Most preferably, the guard traces 32 bound a substantial portion of the lengths of the clock traces 28 and 30, such as much of the length as possible, and also most preferably form a closed loop around the clock traces 28 and 30 to the extent that it is practical to do so. In the embodiment of FIG. 2, the loop formed by the guard traces 32 is closed on the distal end of the clock traces 28 and 30, but is open at the end of the clock traces 28 and 30 where they connect to the conductive lands 16, 22, and 24.

Also depicted in FIG. 2 are the electrically conductive vias 26, which as previously described, preferably make electrical connections to the ground plane 12 of the first layer 8 as depicted in FIG. 1. The vias 26 also preferably make multiple redundant electrical connections with the conductive guard traces 32, to electrically tie them to the potential of the ground plane. It is preferred that there be many such connections through the vias 26, so that all return currents are preferably contained within the same reference structure. Preferably, the vias 26 are disposed at somewhat regular intervals along the lengths of the guard traces 32, and most preferably are regularly spaced along the grounded guard traces at a distance determined at least in part on an operating frequency, which distance may be for example, about one millimeter apart from one another.

Figure 3:
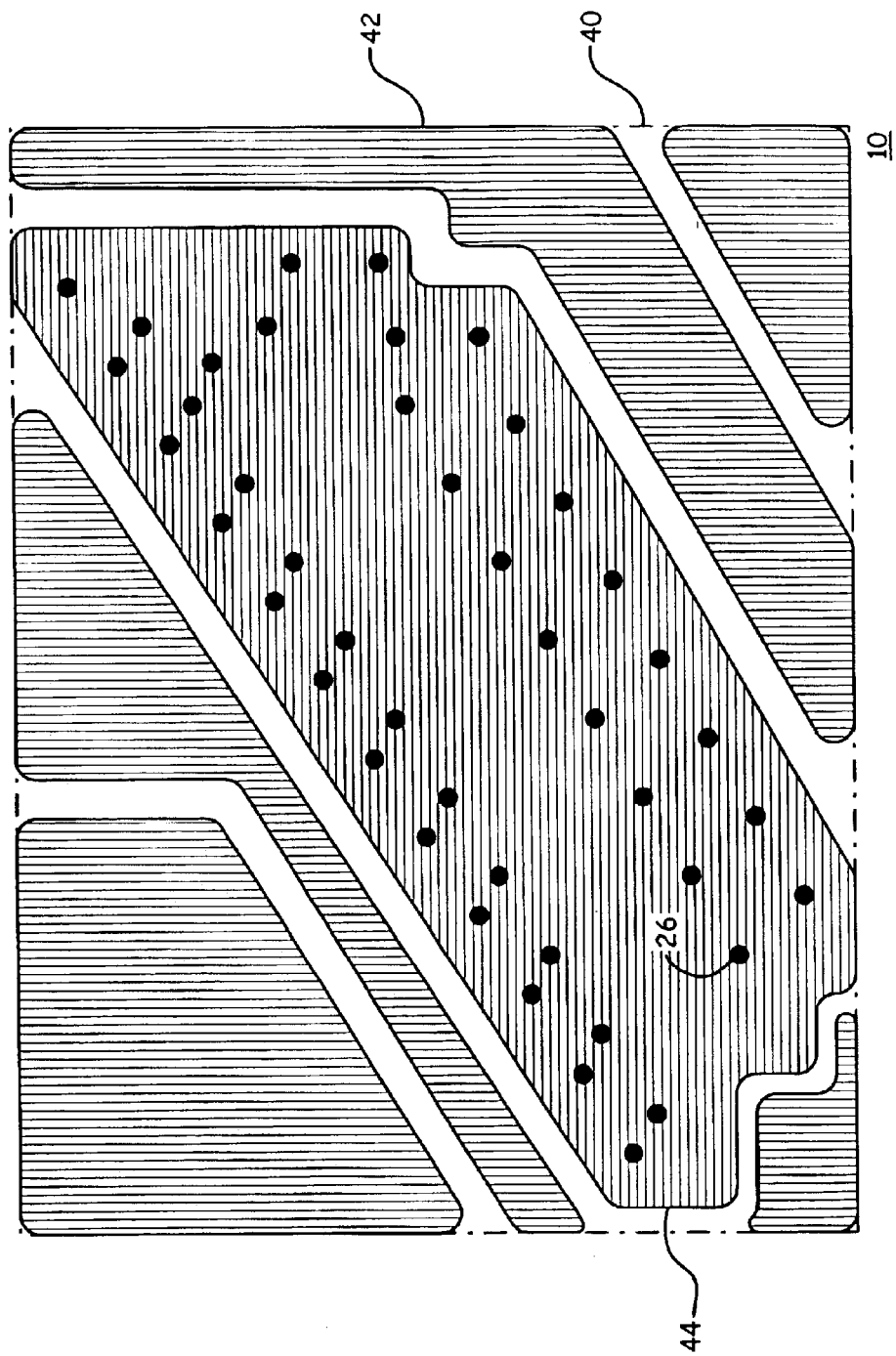
FIG. 3 is a top plan view of a third layer of a package substrate, including a ground plane layer and a power plane layer.

With reference now to FIG. 3, there is depicted a portion of a third layer 40 of the package substrate 10, including power planes 42. The third layer 40 is preferably disposed beneath the second layer 38, and is separated from the second layer 38 by an electrically nonconductive layer. The intervening electrically nonconductive layer preferably includes through-holes, in which are disposed electrically conductive vias 26, in the positions as indicated in FIG. 3. Most preferably, the electrically conductive vias 26 are electrically connected to a ground plane 44 in the third layer 40. Typically, the third layer 40 would only contain power planes 42, and thus the inclusion of a ground plane 44 on this third layer 40 is novel.

Most preferably, the conductive vias 26 extend from the ground plane 44 on the third layer 40 and make electrical connections with the grounded guard traces 32 on the second layer 38, as depicted in FIG. 2. In a most preferred embodiment, the vias 26 are disposed in similar locations in both of the first layer 8 and the third layer 26, so that both of the ground planes 12 and 44 are multiply and redundantly electrically connected to the grounded guard traces 32 on the second layer 38. However, in other embodiments, a portion of the vias 26 as depicted in FIG. 2 extend up to the ground plane 12 on the first layer 8, and a portion of the vias 26 as depicted in FIG. 2 extend down to the ground plane 44 on the third layer 40. The ground planes 12 and 44 may also be electrically connected one to another by other electrical connections which are not depicted in the figures.

Thus, in the preferred embodiment, the clock signal traces 28 and 30 on the second layer 38 are provided with enhanced isolation from other signals by the ground plane 12 on the first layer 8, the grounded guard traces 32 on the second layer 38, and the ground plane 44 on the third layer 40, which are preferably all electrically connected by the vias 26. In a most preferred embodiment, there are no other electrically conductive layers between the first layer 8 and the second layer 38, and between the second layer 38 and the third layer 40.

Figure 4:
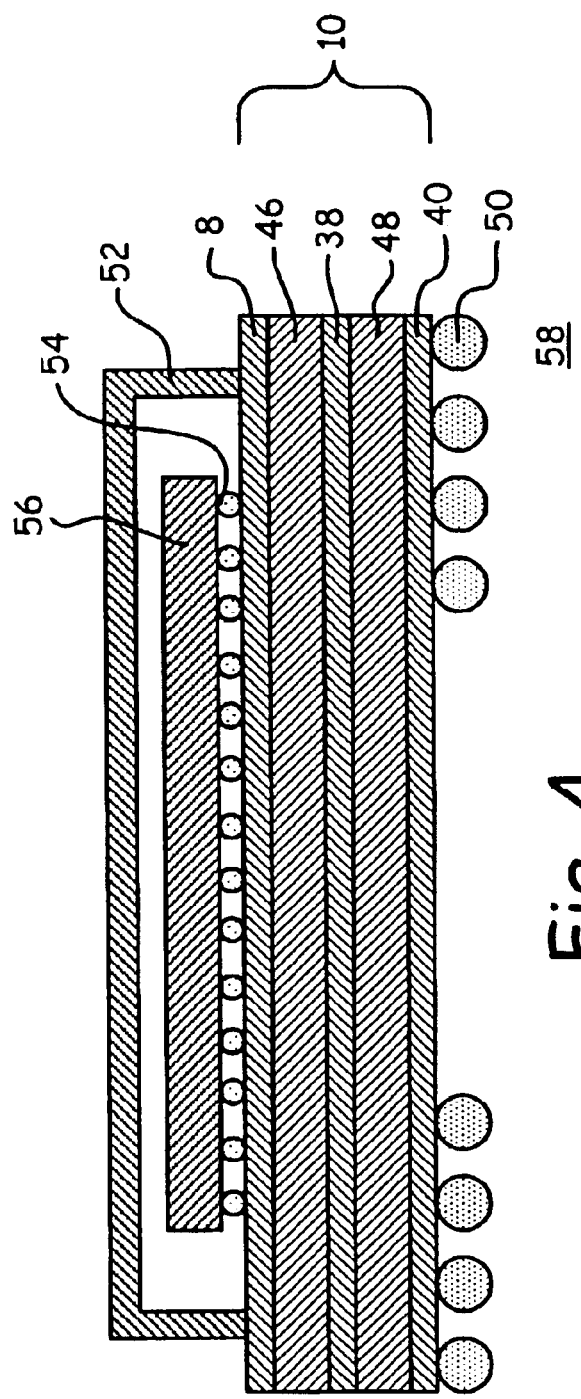
FIG. 4 is a cross sectional view of a packaged integrated circuit.

FIG. 4 depicts a packaged integrated circuit 58 according to the present invention, where the integrated circuit 56 is electrically connected to the package substrate 10 such as by solder bumps 54, and encapsulated against the package substrate 10 such as by lid 52. The packaged integrated circuit 58 preferably makes electrical connections with external circuitry such as by solder balls 50. Also depicted in FIG. 4 are the intervening electrically nonconductive layer 46 disposed between the first layer 8 and the second layer 38, and the intervening electrically nonconductive layer 48 disposed between the second layer 38 and the third layer 40. It is appreciated that there are preferably other layers used as a part of the package substrate 10, which other layers have been omitted so as to focus attention with more particularity on the more important aspects of the invention.

It is further appreciated that one of the aspects of the present invention, is that the structures as described above for conducting the signals of both a single ended clock and a differential clock are all included and laid out as a standard part of the package substrate 10. Thus, an engineer designing an integrated circuit, such as an ASIC, may use either a single ended clock, a differential clock, or both in the design of the integrated circuit, and there are no additional expenses incurred in designing the package substrate to be used with the integrated circuit, because the structures to support the clocks are already present. If one or the other of the clocks is not used, the structure of the package substrate associated with the unused clock may be used to conduct other signals. Although the specialized structure designed for the clock signals may be somewhat of an overkill in terms of conducting other signals, there is no harm in so using the unused clock structure in this manner, and further there is no additional expense in using the unused clock structure in this manner, because it is a standardized part of the package substrate design.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A package substrate, comprising:

a first layer adapted to received an integrated circuit, the first layer having electrically conductive contacts adapted to send and receive signals to and from the integrated circuit, the first layer including a ground plane, a second layer disposed underneath the first layer, the second layer having electrically conductive traces, including a single ended clock signal trace and a set of two differential clock signal traces, where the single ended clock signal trace and the set of two differential clock signal traces are substantially surrounded by grounded guard traces from all other electrically conductive traces on the second layer, and a first electrically nonconductive layer disposed between the first layer and the second layer.

2. The package substrate of claim 1, further comprising through-holes disposed in the first electrically nonconductive layer, with electrically conductive vias disposed in the through-holes, the electrically conductive vias making electrical connections between the ground plane on the first layer and the grounded guard traces on the second layer.

3. The package substrate of claim 1, further comprising through-holes disposed in the first electrically nonconductive layer, with electrically conductive vias disposed in the through-holes, the electrically conductive vias making electrical connections between the ground plane on the first layer and the grounded guard traces on the second layer, where the electrically conductive vias are regularly spaced along the grounded guard traces.

4. The package substrate of claim 1, further comprising through-holes disposed in the first electrically nonconductive layer, with electrically conductive vias disposed in the through-holes, the electrically conductive vias making electrical connections between the ground plane on the first layer and the grounded guard traces on the second layer, where the electrically conductive vias are regularly spaced along the grounded guard traces at a distance determined at least in part on an operating frequency.

5. The package substrate of claim 1, further comprising:

a third layer disposed underneath the second layer, the third layer including a ground plane, and a second electrically nonconductive layer disposed between the second layer and the third layer.

6. The package substrate of claim 5, further comprising through-holes disposed in the second electrically nonconductive layer, with electrically conductive vias disposed in the through-holes, the electrically conductive vias making electrical connections between the ground plane on the third layer and the grounded guard traces on the second layer.

7. The package substrate of claim 5, further comprising through-holes disposed in the second electrically nonconductive layer, with electrically conductive vias disposed in the through-holes, the electrically conductive vias making electrical connections between the ground plane on the third layer and the grounded guard traces on the second layer, where the electrically conductive vias are regularly spaced along the grounded guard traces.

8. The package substrate of claim 5, further comprising through-holes disposed in the second electrically nonconductive layer, with electrically conductive vias disposed in the through-holes, the electrically conductive vias making electrical connections between the ground plane on the third layer and the grounded guard traces on the second layer, where the electrically conductive vias are regularly spaced along the grounded guard traces at a distance determined at least in part on an operating frequency.

9. The package substrate of claim 5, wherein the third layer is a power plane layer.

10. The package substrate of claim 1, wherein the guard traces surround at least as much of the single ended clock signal trace and the set of two differential clock signal traces as possible.

11. The package substrate of claim 1, wherein the guard traces additionally extend substantially between the single ended clock signal trace and the set of two differential clock signal traces.

12. A package substrate, comprising:
   a first layer adapted to received an integrated circuit, the first layer having electrically conductive contacts adapted to send and receive signals to and from the integrated circuit, the first layer including a ground plane,
   a second layer disposed underneath the first layer, the second layer having electrically conductive traces, including a single ended clock signal trace and a set of two differential clock signal traces, where the single ended clock signal trace and the set of two differential clock signal traces are substantially surrounded by grounded guard traces from all other electrically conductive traces on the second layer,
   a first electrically nonconductive layer disposed between the first layer and the second layer, with through-holes disposed in the first electrically nonconductive layer, with electrically conductive vias disposed in the through-holes, the electrically conductive vias making electrical connections between the ground plane on the first layer and the grounded guard traces on the second layer,
   a third layer disposed underneath the second layer, the third layer including a ground plane, and
   a second electrically nonconductive layer disposed between the second layer and the third layer, with through-holes disposed in the second electrically nonconductive layer, with electrically conductive vias disposed in the through-holes, the electrically conductive vias making electrical connections between the ground plane on the third layer and the grounded guard traces on the second layer.

13. The package substrate of claim 12, wherein the electrically conductive vias between the ground plane of the first layer and the grounded guard traces on the second layer are regularly spaced along the grounded guard traces.

14. The package substrate of claim 12, wherein the electrically conductive vias between the ground plane of the first layer and the grounded guard traces on the second layer are regularly spaced along the grounded guard traces at a distance determined at least in part on an operating frequency.

15. The package substrate of claim 12, wherein the electrically conductive vias between the ground plane of the third layer and the grounded guard traces on the second layer are regularly spaced along the grounded guard traces.

16. The package substrate of claim 12, wherein the electrically conductive vias between the ground plane of the third layer and the grounded guard traces on the second layer are regularly spaced along the grounded guard traces at a distance determined at least in part on an operating frequency.

17. A packaged integrated circuit including a package substrate, the package substrate comprising:
   a first layer adapted to received an integrated circuit, the first layer having electrically conductive contacts adapted to send and receive signals to and from the integrated circuit, the first layer including a ground plane,
   a second layer disposed underneath the first layer, the second layer having electrically conductive traces, including a single ended clock signal trace and a set of two differential clock signal traces, where the single ended clock signal trace and the set of two differential clock signal traces are substantially surrounded by grounded guard traces from all other electrically conductive traces on the second layer, and
   a first electrically nonconductive layer disposed between the first layer and the second layer.

18. The packaged integrated circuit of claim 17, further comprising through-holes disposed in the first electrically nonconductive layer, with electrically conductive vias disposed in the through-holes, the electrically conductive vias making electrical connections between the ground plane on the first layer and the grounded guard traces on the second layer.

19. The packaged integrated circuit of claim 17, further comprising:
   a third layer disposed underneath the second layer, the third layer including a ground plane, and
   a second electrically nonconductive layer disposed between the second layer and the third layer.

20. The packaged integrated circuit of claim 19, further comprising through-holes disposed in the second electrically nonconductive layer, with electrically conductive vias disposed in the through-holes, the electrically conductive vias making electrical connections between the ground plane on the third layer and the grounded guard traces on the second layer.

* * * * *